United States Patent
Masino et al.

(10) Patent No.: US 7,230,552 B2
(45) Date of Patent: Jun. 12, 2007

(54) TEMPERATURE COMPENSATION APPARATUS, SYSTEMS, AND METHODS

(75) Inventors: James E. Masino, Houston, TX (US); Roger L. Schultz, Aubrey, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 11/102,119

(22) Filed: Apr. 8, 2005

(65) Prior Publication Data

US 2006/0227024 A1 Oct. 12, 2006

(51) Int. Cl.
*H03M 1/06* (2006.01)

(52) U.S. Cl. .................................. 341/119; 341/155

(58) Field of Classification Search ............... 341/155, 341/120, 118, 143, 144; 702/107
See application file for complete search history.

(56) References Cited

U.S. PATENT DOCUMENTS

| | | | | |
|---|---|---|---|---|
| 4,427,941 A * | 1/1984 | Riedesel et al. | ............ | 324/323 |
| 4,592,002 A * | 5/1986 | Bozarth et al. | ............ | 702/107 |
| 4,604,568 A * | 8/1986 | Prieto | ............ | 323/315 |
| 5,319,370 A * | 6/1994 | Signore et al. | ............ | 341/120 |
| 5,668,506 A * | 9/1997 | Watanabe et al. | ............ | 331/66 |
| 5,669,713 A * | 9/1997 | Schwartz et al. | ............ | 374/1 |
| 5,912,595 A * | 6/1999 | Ma et al. | ............ | 331/117 D |
| 6,082,115 A | 7/2000 | Strnad | ............ | 62/3.7 |
| 6,188,340 B1 * | 2/2001 | Matsumoto et al. | ............ | 341/110 |
| 6,497,146 B1 * | 12/2002 | Hobbs et al. | ............ | 73/504.12 |
| 6,515,548 B2 * | 2/2003 | Matsumoto et al. | ............ | 331/25 |
| 6,603,364 B2 * | 8/2003 | Nemoto | ............ | 331/66 |
| 6,630,955 B2 * | 10/2003 | Takada | ............ | 348/241 |
| 6,769,298 B2 * | 8/2004 | Matsumura et al. | ............ | 73/204.15 |
| 2003/0210917 A1 * | 11/2003 | Stewart et al. | ............ | 398/209 |

OTHER PUBLICATIONS

"Integrated voltage reference circuits: REF195, http://www.analog.com/en/prod/0%2C2877%2CREF195%2C00.html", 28 pgs, 2004 no month.
"Integrated voltage reference circuits: LM199, http://www.linear.com/prod/datasheet.html?datasheet=698", 5 pgs, no date.
"Integrated voltage reference circuits: LT1019, http://www.linear.com/prod/datasheet.html?datasheet=95", 12 pgs, no date.
"Integrated voltage reference circuits: LT1021, http://www.linear.com/prod/datasheet/html?datasheet=160", 16 pgs, no date.

(Continued)

*Primary Examiner*—Peguy JeanPierre
(74) *Attorney, Agent, or Firm*—Schwegman, Lundburg, Woessner and Kluth P.A.

(57) ABSTRACT

In some embodiments, apparatus and systems, as well as methods, may include providing an analog temperature output responsive to a combination signal comprising a combination of an analog compensation output and a reference signal, and converting the analog temperature output to a digital temperature output responsive to an analog reference signal output, perhaps according to a polynomial function. Providing a digital compensation output corresponding to the digital temperature output, and converting the digital compensation output to the analog compensation output responsive to the analog reference signal output may also be included.

29 Claims, 5 Drawing Sheets

OTHER PUBLICATIONS

"Temperature Compensated (TC)—voltage Reference—Zener Diodes: 1N829A, http://www.itc-electronics.com/CD/motorola%2010030/TechData/Zeners/1n821_1n829.pdf", 3pgs, no date.

"Temperature Compensated(TC)—Voltage Reference—Zener Diodes: 1N946, http://www.semtexinternational.com/SDiv/SPL/ZPL/TCZ/T.C._Zeners. PDF", 1 pg, no date.

* cited by examiner

TEMPERATURE COMPENSATION APPARATUS, SYSTEMS, AND METHODS

TECHNICAL FIELD

Various embodiments described herein relate to electrical circuitry generally, including the adjustment of circuit operation responsive to changes in environmental temperature.

BACKGROUND INFORMATION

Some circuits are designed to provide a source of voltage or current to serve as a reference for other circuits, including analog-to-digital converters (ADCs) and digital-to-analog converters (DACs). Thus, the accuracy of the reference often determines the accuracy of the circuitry so supplied. As greater numbers of measurement systems are deployed in hostile environments with a variety of temperatures, the demand for apparatus and methods that provide precision reference signals in such environments will increase. For these and other reasons there is a need for apparatus and methods that provide a substantially stable reference signal over a wide temperature range.

DETAILED DESCRIPTION

In some embodiments of the invention, the challenges described above may be addressed by providing a temperature compensation mechanism that operates to follow the output temperature drift of a first order reference circuit, minus the reference output. The resulting error correction signal may then be summed along with the original output so as to form a compensated output with minimal drift due to temperature. Thus, if the output of the first order reference circuit can be digitized with sufficient resolution, the temperature compensated voltage can be added to the first order voltage reference source such that its output remains substantially unchanged over a large temperature range, including a range of about 0° C. to about 200° C.

In some embodiments, the first order reference circuit may include an inversely proportional to absolute temperature (IPTAT) sensor comprising a forward biased PN junction (having a substantially constant current through the junction). The generated voltage provided by the first order reference circuit may then be digitized and serve as the input to a polynomial function, using fixed point math if desired. Since the polynomial function can be implemented in digital form, the resulting performance may be relatively immune to temperature variations.

Figure 1:
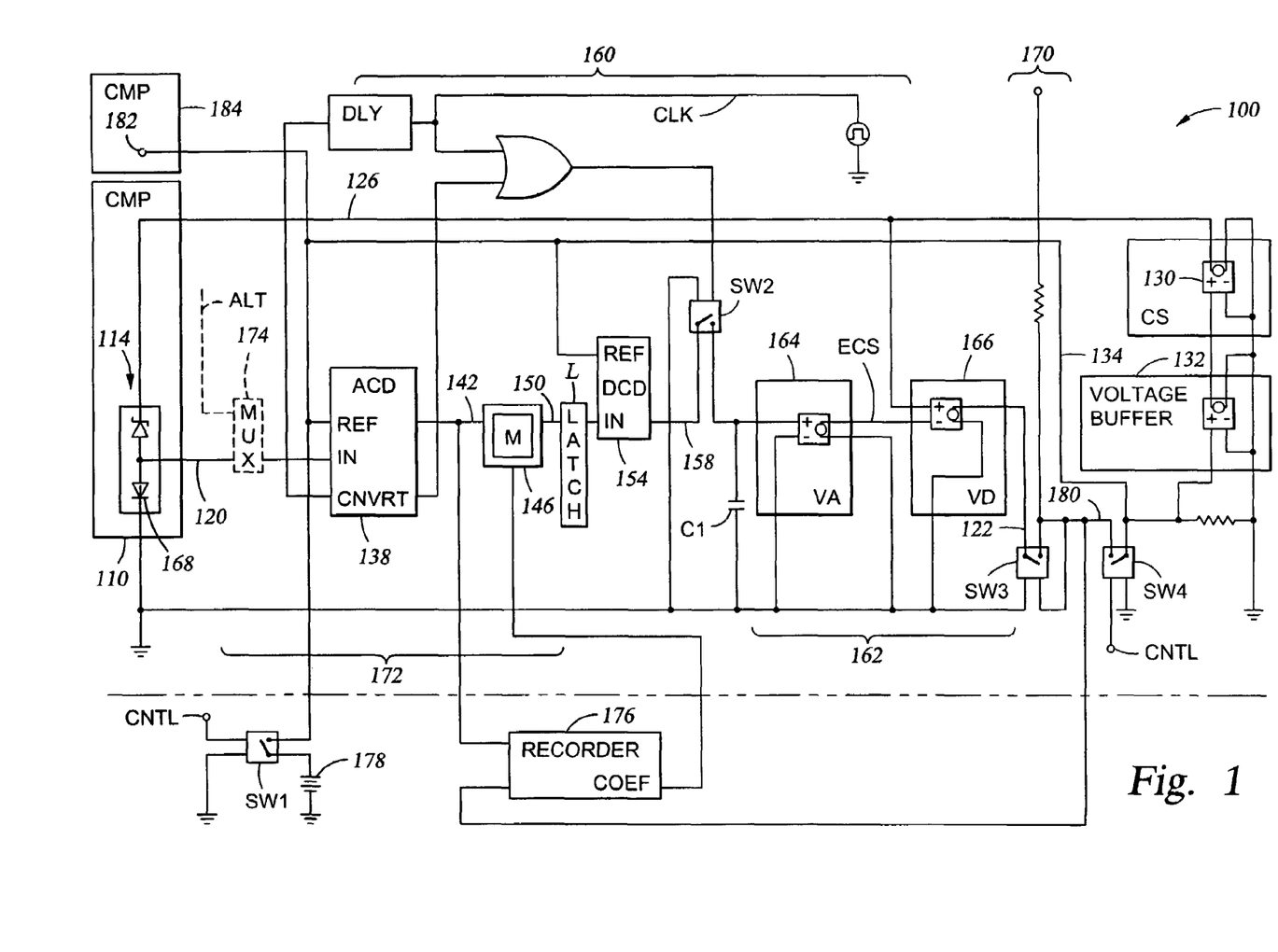
FIG. 1 is a schematic diagram of an apparatus according to various embodiments.
Figure 2:
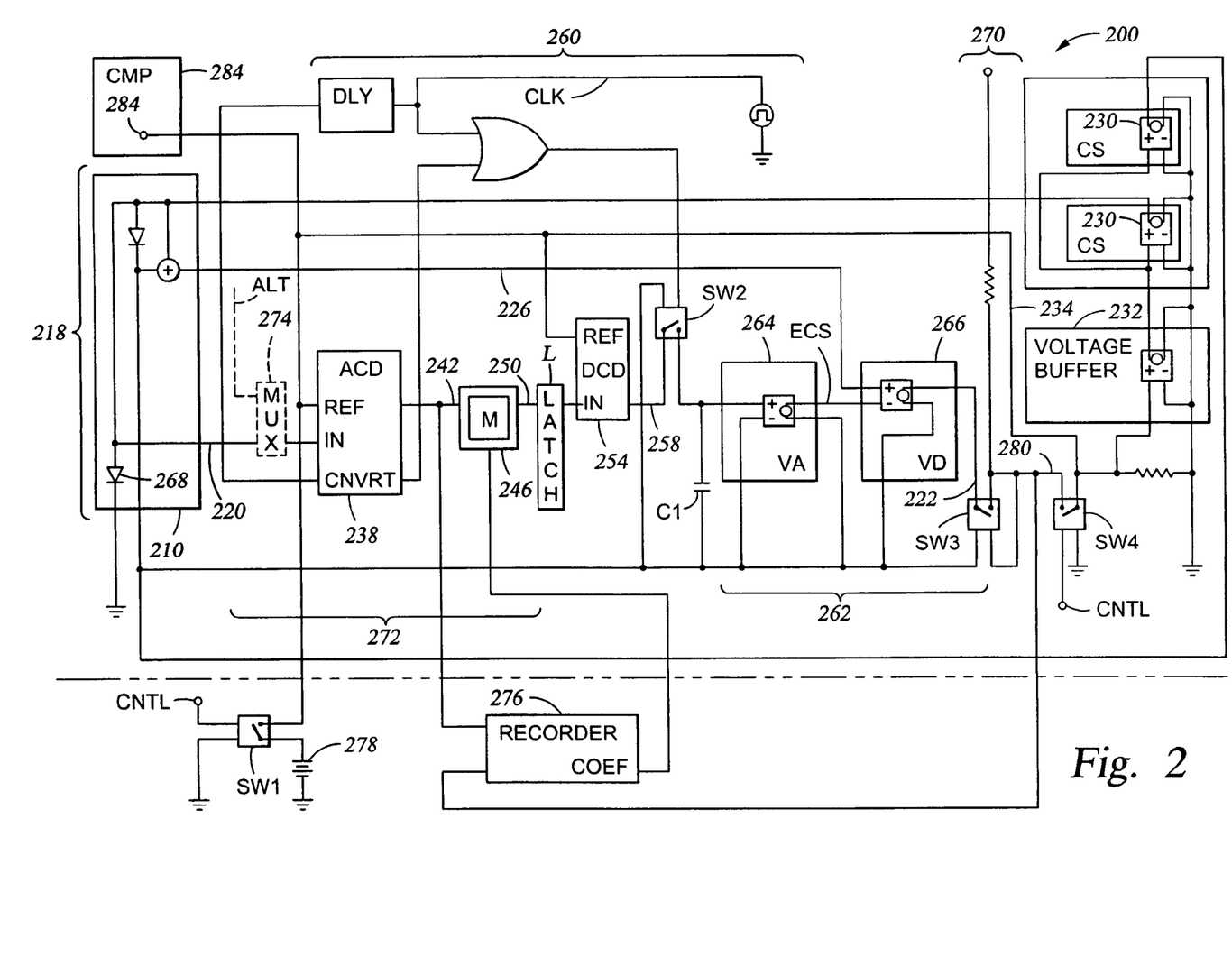
FIG. 2 is a schematic diagram of an apparatus according to various embodiments.

FIGS. 1 and 2 are schematic diagrams of apparatus 100, 200 according to various embodiments, each of which may operate in the manner previously described. It should be noted that various embodiments may be discussed in general terms, as well as with respect to specific circuit components. The use of such methodology should not be construed as limiting the embodiments described to the use of the specific components described, but rather as a teaching mechanism that operates to concretely represent various abstract concepts to the reader.

In some embodiments, an apparatus 100, 200 may include reference signals 126, 226 provided by the reference signal sources 110, 210, perhaps including a zener diode 114, such as a temperature-compensated (TC) diode, and a band-gap reference 218, respectively. Thus, the reference signal sources 110, 210 may comprise voltage reference signal sources.

The zener diode 114 and band-gap reference 218 may be powered by one or more constant current sources. Thus, the reference signal sources 110, 210 may additionally provide analog temperature outputs 120, 220, perhaps generated by holding a substantially constant current through diodes 168, 268. The diode 168 may provide temperature compensation for the zener diode 114, and the diode 268 may provide one of the PN junctions necessary to form the band-gap reference 218. In some embodiments, the band-gap reference 218 and the zener diode 114 may provide a substantially constant first order reference signal 126, 226.

Thus, embodiments of the apparatus 100, 200 may be implemented using a variety of reference signal sources 110, 210 that have advantages and disadvantages when compared to each other, but in each case the topology of the apparatus 100, 200 may remain substantially the same. For example, including a TC zener diode 114 may permit greater temperature stability over a much larger operating temperature range then a first order band-gap reference 218. On the other hand, the band-gap reference 218 may be designed to operate with a smaller supply voltage than the zener diode 114, given a selected operating temperature range.

Depending on the specific circuit elements used to implement various embodiments, the apparatus 100, 200 may further include one or more current sources 130, 230 to receive an analog reference signal output 134, 234 and to drive the reference signal sources 110, 210. For example, the current source(s) 130, 230 may comprise voltage-to-current amplifiers. A reference signal source 210 that includes a band-gap reference 218 may use two current sources 230, whereas a reference signal source 210 that includes a zener diode 114 may use one current source 130. Thus, in each case, one or more voltage-to-current-sources may be used for operation. A voltage buffer 132, 232 may provide voltage to the current sources 130, 230.

The apparatus 100, 200 may include an analog conversion device 138, 238, such as an ADC, to convert the analog temperature output 120, 220 to a digital temperature output 142, 242. The conversion process may be responsive to the analog reference signal output 134, 234.

The apparatus 100, 200 may also include a digital function device 146, 246, perhaps comprising a memory and/or programmable logic device (PLD), to provide a digital compensation output 150, 250 corresponding to the digital temperature output 142, 242. Thus, the digital function device 146, 246 may include a memory M and be programmed to implement a mathematical function to be applied to the digital temperature output 142, 242. The mathematical function may comprise any number of functions, including a polynomial function. In some embodiments the memory M may store information that applies the mathematical function to the digital temperature output 142, 242 to provide a digital compensation output 150, 250, perhaps by accessing a table of conversion values in the memory M, where individual digital compensation output 150, 250 selections are governed by specific digital temperature output 142, 242 values presented to the input of the digital function device 146, 246.

For example, the digital function device 146, 246 may contain the coefficient and constants for a logical implementation of a fixed point polynomial math function. In some embodiments, a processor interface might be included in the digital function device 146, 246 to permit the coefficients and constants to be written directly into the digital function device 146, 246, instead of being burned or programmed.

The apparatus 100, 200 may also include a digital conversion device 154, 254, such as a DAC, to convert the digital compensation output 150, 250 to an analog compensation output 158, 258. As is the case with the analog conversion device 138, 238, the conversion process may be responsive to the analog reference signal output 134, 234.

A combination element 162, 262 may be used to provide the combination signal 122, 222. For example, as shown in FIGS. 1 and 2, the combination element 162, 262 may comprise a voltage buffer/scalar amplifier 164, 264 and a voltage difference amplifier 166, 266 coupled to the analog compensation output 158, 258. In some embodiments, the combination signal 122, 222 may include a combination of the analog compensation output 158, 258 and the reference signal 126, 226.

During regular operation (e.g., not during the start-up time period) the reference signal source 110, 210, the analog conversion device 138, 238, the digital function device 146, 246, the digital conversion device 154, 254, and the current sources 130, 230 may operate to form a closed loop circuit. For example, in the embodiments shown in FIGS. 1 and 2, it may be noted that the zener diode and band-gap reference circuits have a diode 168, 268 that generates an IPTAT voltage (e.g., analog temperature output 120, 220), and that the diode 168, 268 may be driven by one or more voltage to current sources (e.g., sources 130, 230). Thus, the analog temperature output 120, 220 may be one of the analog inputs to the analog conversion device 138, 238; another may be the analog reference signal output 134, 234.

To trace a possible signal path, one may assume that the analog reference signal output 134, 234 is following the desired output voltage (typically not the case under startup conditions). Continuing along the signal path, the analog temperature output 120, 220 (e.g., a voltage) may be digitized by the analog conversion device 138, 238, with the result (e.g., digital temperature output 142, 242) passed on to the digital function device 146, 246. The digital function device 146, 246, in turn, may apply a fixed-point polynomial function to the digital temperature output 142, 242, and the results (e.g., digital compensation output 150, 250) may then be converted back to an analog signal (e.g., the analog compensation output 158, 258), such as an analog voltage, by the digital conversion device 154, 254.

In some implementations of the apparatus 100, 200, glitches present at the analog compensation output 158, 258 may present a problem to smooth operation. It may be desirable in such cases that the apparatus 100, 200 be designed to include a gated sampling mechanism 160, 260 coupled to receive the analog compensation output 158, 258. The gated sampling mechanism 160, 260 may include a switch SW2 coupled to the digital conversion device 154, 254 and a clock signal CLK. Thus, the analog compensation output 158, 258 may then be sampled by an analog switch SW2 to gate out and remove glitches that might otherwise be present as a result of switching the digital conversion device 154, 254.

A capacitor, such as capacitor C1, may be used to temporarily hold the analog compensation output 158, 258 when switch SW2 opens. To obtain the error correction signal (ECS) the charge at the capacitor C1 may then be buffered and scaled by the voltage amplifier 164, 264. The ECS can be used to mirror changes (e.g., those changes that would otherwise occur without its use) in the analog reference signal output 134, 234. The ECS appears at the negative input of the voltage difference amplifier 166, 266. The other (e.g., positive) input of the voltage difference amplifier 166, 266 may comprise the voltage at the output of either the zener diode 114 or the band-gap reference 218 (e.g., the reference signal 126, 226); in either case the difference voltage appears at the output and represents a final temperature compensated voltage reference. During regular operation (e.g., not in startup or calibration mode), the switches SW3 and SW4 are kept closed so the output from the voltage difference amplifier 166, 266 appears as the analog reference signal output 134, 234.

As mentioned earlier, the analog reference signal output 134, 234 may comprise one of the inputs to the analog conversion device 138, 238. Those skilled in the art will recognize that varying the analog reference signal output 134, 234 may result in scaling the analog to digital conversion process.

It may appear problematic that the input and reference to the analog conversion device 138, 238 can change, when typically it is common to have a fixed reference. However, it should be noted that the described circuitry is designed to minimize the voltage change of the reference, which is dominated or controlled by the reference signal source 110, 210 to a first order approximation. Through the use of the ECS a small magnitude correction may be made to the analog reference signal output 134, 234 in order to remove temperature dependences that may exist in either the zener diode 114, or the band-gap reference 218.

At the time of circuit startup (e.g., when power is first applied), the apparatus 100, 200 may tend to lock on to providing an analog reference signal output 134, 234 that is at or near zero volts. This is because the circuit may have two stable operating points: one may be near zero volts and the other may be near or at the desired reference voltage. To prevent stabilizing at zero volts, for example, the apparatus 100, 200 may include startup circuitry 170, 270 used to couple a power supply output as a reference voltage 180, 280 for the purpose of providing a non-zero analog temperature output 120, 220. Thus, SW3 may be opened when the analog reference signal output 134, 234 falls below some minimal voltage to insure that a useful voltage is provided by the reference signal sources 110,210. Therefore, the startup circuitry 170, 270 may be responsive to a selected minimum level of the analog reference signal output 134, 234, perhaps selected to be some value between ground and the analog reference signal output 134, 234.

The apparatus 100, 200 may be used in a variety of ways. For example, it may be desirable to separate the operation of the analog conversion device 138, 238 from the rest of the circuitry in order to use it for sampling other signals, such as alternative signal ALT, especially if the apparatus is operating at a relatively stable environmental temperature. In such instances, the apparatus 100, 200 may include a switching circuit 172, 272 to remove coupling between the analog conversion device 138, 238 from the analog temperature output 120, 220 and the digital function device 146, 246. The switching circuit 172, 272 may include a multiplexer 174, 274 coupled to the analog temperature output 120, 220 and a latch L coupled to the digital function device 146, 246. To simplify the drawings the control signals to the multiplexer 174, 274 have not been shown. Such control signals are known to those of skill in the art, and might be used in addition for enabling and disabling various operations or functions, such as selecting the alternative signal ALT. The latch function shown separately for clarity may be implemented in the digital function device 146, 246. Alternatively, the gated sampling mechanism 160, 260 may be implemented within the digital function device 146, 246. Though not shown schematically, the gated sampling mechanism 160, 260 might be enabled/disabled during use of the alternative signal ALT.

Calibration of the apparatus 100, 200 may initially be desired under various circumstances. If such is the case, the apparatus 100, 200 may utilize a recording module 176, 276 to couple to the analog conversion device 138, 238 for the purpose of gathering raw temperature reference data from the reference signal sources 110, 210. The recording module 176, 276 may comprise a personal computer outfitted to accomplish the tasks described herein. SW1 and SW4 may be used during calibration so that a calibration reference 178, 278 (e.g., a known standard) can be connected to the analog conversion device 138, 238 and the digital conversion device 154, 254 so as to replace the function of the analog reference signal output 134, 234.

During calibration activity the apparatus 100, 200 circuitry may be swept through a selected operating temperature range (e.g., about 0° C. to about 200° C.) so that the analog temperature output 120, 220 and the reference voltage 180, 280 can be recorded at each desired temperature, such as at intervals of approximately 1° C. Then, perhaps using a least-square fitting function with the recorded analog temperature output 120, 220 and reference voltage 180, 280 arrays as inputs and outputs, respectively, the coefficients for a polynomial fit may be determined, as is known to those of skill in the art. Other curve fitting functions might also be useful. Before the coefficients, including any offset constant, are used, they may be scaled as needed, and the offset value may be reduced by the value of the reference output.

The amount of memory M required to perform high order curvature correction may be relatively small, such that apparatus 100, 200 produced according to the teachings herein may be economical and feasible to produce. The digital compensation circuitry included in the digital function device 146, 246, may tolerate temperature variations very well, and may thus provide excellent long term repeatability. Initial accuracy of various apparatus 100, 200 can also be set digitally by adjusting the polynomial offset constant, avoiding the use of special trimming techniques (e.g., those typically used for trimming an analog voltage references).

The apparatus 100, 200 may be constructed in a number of ways. For example, the apparatus 100, 200 may be formed by using a combination of discrete components. In some cases, the various components may be integrated, perhaps being manufactured as an application specific integrated circuit (ASIC). For example, the reference signal source 110, 210, the analog conversion device 138, 238, the digital function device 146, 246, and the digital conversion device 154, 254 may all be formed as part of a single die. If further integration is desired, the analog reference signal output 134, 234 may be coupled to a reference voltage input 182, 282 formed on the die (e.g., a silicon-on-sapphire or silicon-on-insulator substrate), which may in turn be included in another component 184, 284, such as an ADC, a DAC, and/or an operational amplifier.

Figure 3:
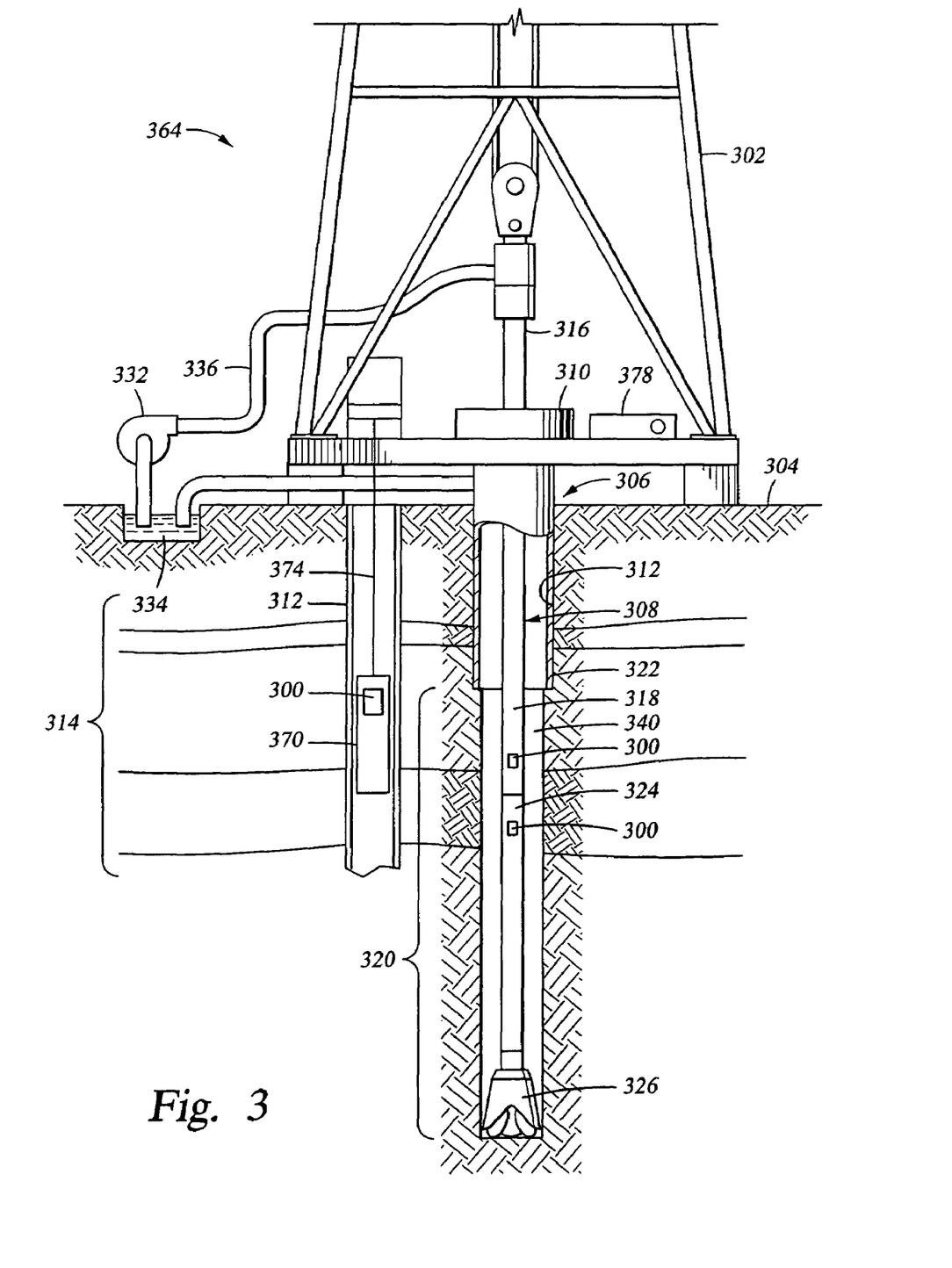
FIG. 3 is an illustration of apparatus and systems according to various embodiments.

FIG. 3 is an illustration of apparatus 300 and systems 364 according to various embodiments, which may comprise portions of a downhole tool 324 as part of a downhole drilling operation. Thus, in some embodiments, a system 364 may form a portion of a drilling rig 302 located at a surface 304 of a well 306. The drilling rig 302 may provide support for a drill string 308. The drill string 308 may operate to penetrate a rotary table 310 for drilling a borehole 312 through subsurface formations 314. The drill string 308 may include a Kelly 316, drill pipe 318, and a bottom hole assembly 320, perhaps located at the lower portion of the drill pipe 318.

The bottom hole assembly 320 may include drill collars 322, a downhole tool 324, and a drill bit 326. The drill bit 326 may operate to create a borehole 312 by penetrating the surface 304 and subsurface formations 314. The downhole tool 324 may comprise any of a number of different types of tools including MWD (measurement while drilling) tools, LWD (logging while drilling) tools, and others.

During drilling operations, the drill string 308 (perhaps including the Kelly 316, the drill pipe 318, and the bottom hole assembly 320) may be rotated by the rotary table 310. In addition to, or alternatively, the bottom hole assembly 320 may also be rotated by a motor (e.g., a mud motor) that is located downhole. The drill collars 322 may be used to add weight to the drill bit 326. The drill collars 322 also may stiffen the bottom hole assembly 320 to allow the bottom hole assembly 320 to transfer the added weight to the drill bit 326, and in turn, assist the drill bit 326 in penetrating the surface 304 and subsurface formations 314.

During drilling operations, a mud pump 332 may pump drilling fluid (sometimes known by those of skill in the art as "drilling mud") from a mud pit 334 through a hose 336 into the drill pipe 318 and down to the drill bit 326. The drilling fluid can flow out from the drill bit 326 and be returned to the surface 304 through an annular area 340 between the drill pipe 318 and the sides of the borehole 312. The drilling fluid may then be returned to the mud pit 334, where such fluid is filtered. In some embodiments, the drilling fluid can be used to cool the drill bit 326, as well as to provide lubrication for the drill bit 326 during drilling operations. Additionally, the drilling fluid may be used to remove subsurface formation 314 cuttings created by operating the drill bit 326.

Thus, referring now to FIGS. 1, 2, and 3, it may be seen that in some embodiments, the system 364 may include a drill collar 322, a downhole tool 324, and/or a tool body 370 to house one or more apparatus 300, similar to or identical to the apparatus 100, 200 described above and illustrated in FIGS. 1 and 2. In some applications, the tool body 370 may comprise a wireline logging tool, for example, and be coupled to a logging cable 374.

The apparatus 100, 200, 300; reference signal sources 110, 210; zener diode 114; band-gap reference 210; analog temperature outputs 120, 220; combination signals 122, 222; reference signals 126, 226; current sources 130, 230; voltage buffers 132, 232; analog reference signal outputs 134, 234; analog conversion devices 138, 238; digital temperature outputs 142, 242; digital function devices 146, 246; digital compensation outputs 150, 250; digital conversion devices 154, 254; analog compensation outputs 158, 258; gated sampling mechanisms 160, 260; combination elements 162, 262; voltage buffer/scalar amplifiers 164, 264; voltage difference amplifiers 166, 266; alternative signal ALT; capacitor C1; error correction signal ECS; memory M; switches SW1, SW2, SW3, and SW4; startup circuitry 170, 270; switching circuits 172, 272; multiplexers 174, 274; recording modules 176, 276; calibration references 178, 278; reference voltages 180, 280; reference voltage inputs 182, 282; components 184, 284; drilling rig 302; surface 304; well 306; drill string 308; rotary table 310; borehole 312; subsurface formations 314; Kelly 316; drill pipe 318; bottom hole assembly 320; drill collars 322; downhole tool 324; drill bit 326; mud pump 332; mud pit 334; hose 336; annular area 340; system 364; tool body 370; and logging cable 374 may all be characterized as "modules" herein. Such modules may include hardware circuitry, and/or a processor and/or memory circuits, software program modules and objects, and/or firmware, and combinations thereof, as desired by the architect of the apparatus 100, 200, 300 and systems 364, and as appropriate for particular implementations of various embodiments. For example, in some embodiments, such modules may be included in an apparatus and/or system operation simulation package, such as a software electrical signal simulation package, a power usage and distribution simulation package, a capacitance-inductance simulation package, a power/heat dissipation simulation package, and/ or a combination of software and hardware used to simulate the operation of various potential embodiments.

It should also be understood that the apparatus and systems of various embodiments can be used in applications other than for drilling operations, and thus, various embodiments are not to be so limited. The illustrations of apparatus 100, 200, 300 and systems 364 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules, including multilayer, multi-chip modules. Such apparatus and systems may further be included as sub-components within a variety of electronic systems, such as televisions, cellular telephones, personal computers, workstations, radios, video players, vehicles, voltage references for geothermal tools and smart transducer interface node telemetry systems, among others. Some embodiments include a number of methods.

Figure 4:
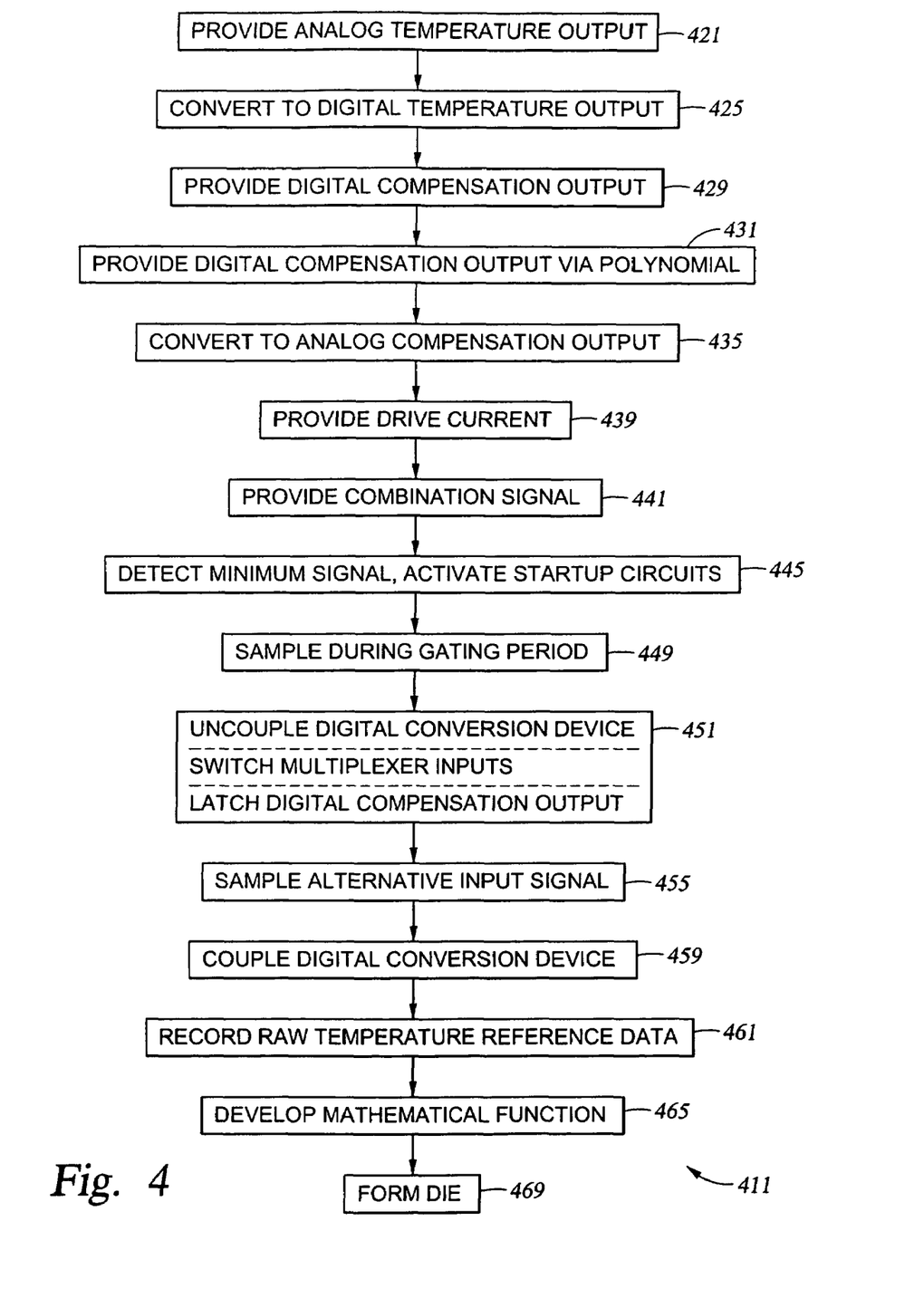
FIG. 4 is a flow chart illustrating several methods according to various embodiments.

For example, FIG. 4 is a flow chart illustrating several methods according to various embodiments. In some embodiments of the invention, a method 411 may (optionally) begin at block 421 with providing an analog temperature output responsive to a combination signal, perhaps comprising a combination of an analog compensation output and a reference signal. The method 411 may then continue with converting the analog temperature output to a digital temperature output responsive to an analog reference signal output at block 425, as well as providing a digital compensation output corresponding to the digital temperature output at block 429. The method 411 may include providing the digital compensation output corresponding to the digital temperature output according to a polynomial function at block 431, which may comprise a fixed-point polynomial function.

In some embodiments, the method 411 may include converting the digital compensation output to the analog compensation output responsive to the analog reference signal output at block 435. The method 411 may continue with providing a current to drive the reference signal source responsive to the analog reference signal output at block 439. Providing the current may be accomplished using one or more voltage-to-current sources, as discussed previously. The method 411 may include providing the combination signal as a difference of the analog compensation output and the reference signal at block 441.

During selected operational modes, such as during startup operations, the method 411 may include detecting the analog reference signal output falling below a selected minimum level, and activating startup circuitry coupled to the reference signal source to provide a non-zero analog temperature output at block 445. To reduce the number of glitches present in various output signals, the method 411 may include sampling the analog compensation output during a selected gating period at block 449.

As noted previously, the analog conversion device may be used to digitize alternative signals. Thus, during some operational modes, the method 411 may include uncoupling the analog conversion device from the analog temperature output and the digital function device at block 451. Uncoupling the analog conversion device may include switching a plurality of inputs included in a multiplexer coupled to the analog temperature output, and/or latching the digital compensation output. The method 411 may also include sampling an alternative input signal using the analog conversion device at block 455, and then coupling the analog conversion device to the analog temperature output and the digital function device at block 459.

During some operational modes, including calibration activities, the method 411 may include recording raw temperature reference data provided by the analog conversion device over a selected temperature range, such as about 0° C. to about 200° C., at block 461. The method 411 may continue with formulating a mathematical function based on the raw temperature reference data to apply to the digital temperature output at block 465. As noted previously, the mathematical function may comprise a polynomial function, among others. In some embodiments, the method 411 may include forming the reference signal source, the analog conversion device, the digital function device, and the digital conversion device as part of a single die, such as a silicon-on-sapphire or silicon-on-insulator substrate.

The activities shown in the method 411 may be accomplished in a number of ways. For example, the method 411 may include providing a digital compensation output corresponding to a digital temperature output at block 429, wherein an analog temperature output is provided responsive to a combination signal comprising a combination of an analog compensation output and a reference signal. In this case, the analog temperature output may be converted to the digital temperature output responsive to an analog reference signal output, and the digital compensation output may be converted to the analog compensation output responsive to the analog reference signal output.

It should be noted that the methods described herein do not have to be executed in the order described, or in any particular order. Moreover, various activities described with respect to the methods identified herein can be executed in iterative, serial, or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment. Thus, other embodiments may be realized.

Figure 5:
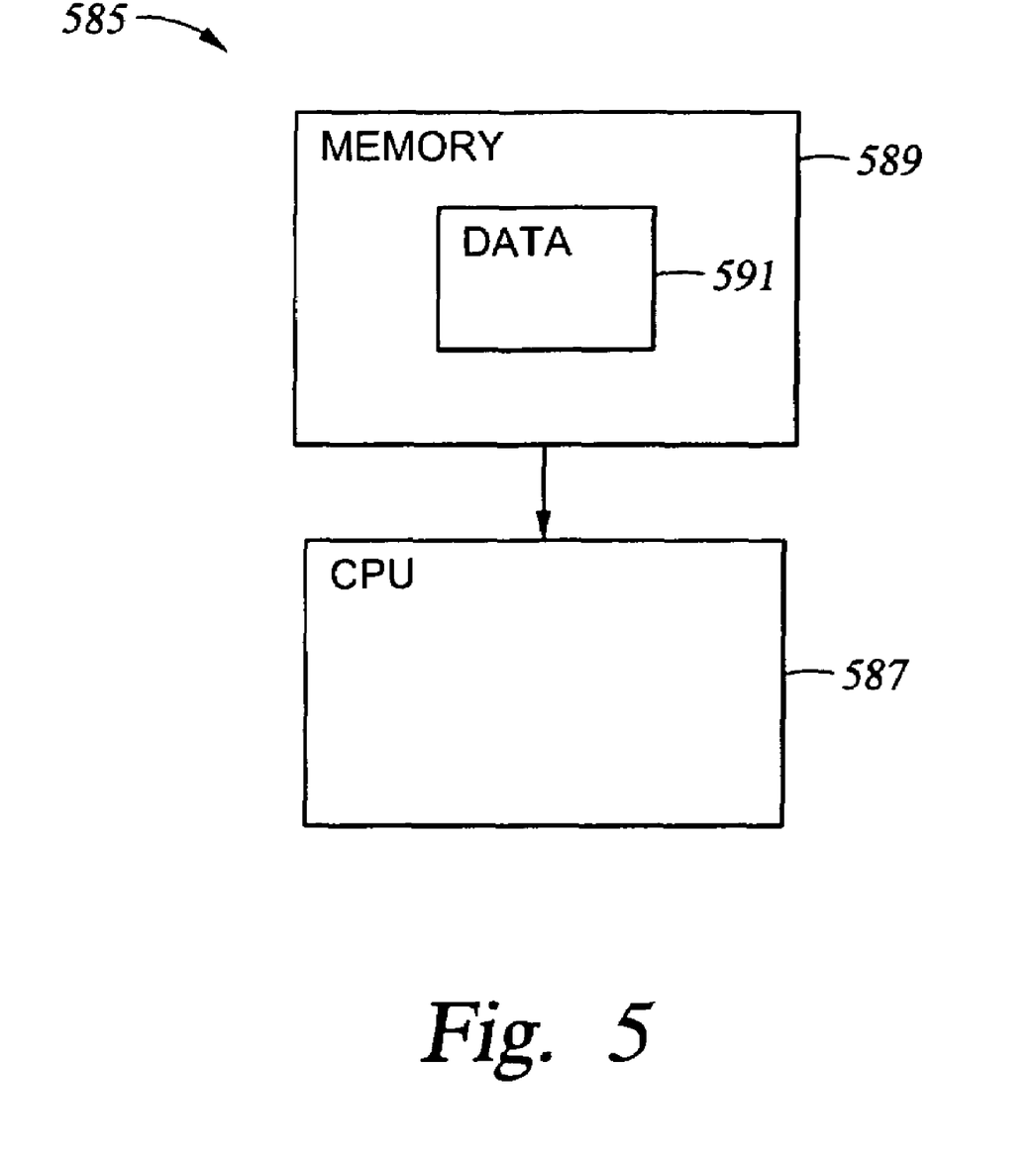
FIG. 5 is a block diagram of an article according to various embodiments.

FIG. 5 is a block diagram of an article 585 according to various embodiments, such as a computer, a memory system, a magnetic or optical disk, some other storage device, and/or any type of electronic device or system. The article 585 may include a processor 587 coupled to a machine-accessible medium such as a memory 589 (e.g., removable storage media, as well as any memory including an electrical, optical, or electromagnetic conductor) having associated information 591 (e.g., computer program instructions and/or data), which when accessed, results in a machine (e.g., the processor 587) performing such actions as providing a digital compensation output corresponding to a digital temperature output. In this case, an analog temperature output may be provided responsive to a combination signal comprising a combination of an analog compensation output and a reference signal. In addition, the analog temperature output may be converted to the digital temperature output responsive to an analog reference signal output, and the digital compensation output may be converted to the analog compensation output responsive to the analog reference signal output.

Further actions may include providing the digital compensation output corresponding to the digital temperature output according to a polynomial function. The polynomial function may comprise a fixed-point polynomial function, as noted previously.

Depending on the functions used to correct the analog signal output, the apparatus, systems, and methods disclosed herein may be used to provide a voltage reference source for use over a large temperature operating range, or perhaps a limited range with superior accuracy. That is, range and accuracy might be traded one for the other as desired, depending upon specific application requirements.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, comprising:
a reference signal source to provide an analog temperature output responsive to a combination signal comprising a combination of an analog compensation output and a reference signal;
an analog conversion device to convert the analog temperature output to a digital temperature output responsive to an analog reference signal output;
a digital function device to provide a digital compensation output corresponding to the digital temperature output; and
a digital conversion device to convert the digital compensation output to the analog compensation output responsive to the analog reference signal output.

2. The apparatus of claim 1, further comprising:
a combination element to provide the combination signal comprising a difference of the analog compensation output and the reference signal.

3. The apparatus of claim 1, further comprising:
startup circuitry coupled to the reference signal source to provide a non-zero analog temperature output.

4. The apparatus of claim 3, wherein the startup circuitry is responsive to a selected minimum level of the analog reference signal output.

5. The apparatus of claim 1, further comprising:
a gated sampling mechanism coupled to receive the analog compensation output.

6. The apparatus of claim 1, further comprising:
a switching circuit to removably couple the analog conversion device to the analog temperature output and the digital function device.

7. The apparatus of claim 1, further comprising:
a recording module to couple to the digital function device and to gather raw temperature reference data provided by the analog conversion device.

8. The apparatus of claim 1, wherein the digital function device further comprises:
a mathematical function to apply to the digital temperature output.

9. The apparatus of claim 8, wherein the mathematical function comprises a polynomial function.

10. The apparatus of claim 1, wherein the reference signal source comprises one of a temperature-compensated zener diode and a band-gap reference.

11. The apparatus of claim 1, wherein the reference signal source, the analog conversion device, the digital function device, and the digital conversion device are formed as part of a single die, and wherein the analog reference signal output is coupled to a reference voltage input formed on the die and included in one of an analog to digital converter, a digital to analog converter, and an operational amplifier.

12. A system, comprising:
an apparatus including a reference signal source to provide an analog temperature output responsive to a combination signal comprising a combination of an analog compensation output and a reference signal, an analog conversion device to convert the analog temperature output to a digital temperature output responsive to an analog reference signal output, a digital function device to provide a digital compensation output corresponding to the digital temperature output, and a digital conversion device to convert the digital compensation output to the analog compensation output responsive to the analog reference signal output; and
one of a drill collar, a downhole tool, and a tool body to house the apparatus.

13. The system of claim 12, wherein the downhole tool comprises a tool selected from one of a wireline logging tool and a logging while drilling (LWD) tool, and wherein the tool body comprises wireline logging tool.

14. The system of claim 12, wherein the combination signal comprises a difference of the analog compensation output and the reference signal.

15. The system of claim 12, further comprising:
startup circuitry coupled to the reference signal source to provide a non-zero analog temperature output.

16. The system of claim 12, wherein the digital function device further comprises:
a mathematical function to apply to the digital temperature output.

17. The system of claim 12, wherein the temperature signal source comprises one of a temperature-compensated zener diode and a band-gap reference.

18. A method, comprising:
providing an analog temperature output responsive to a combination signal comprising a combination of an analog compensation output and a reference signal;
converting the analog temperature output to a digital temperature output responsive to an analog reference signal output;
providing a digital compensation output corresponding to the digital temperature output; and
converting the digital compensation output to the analog compensation output responsive to the analog reference signal output.

19. The method of claim 18, further comprising:
providing the combination signal as a difference of the analog compensation output and the reference signal.

20. The method of claim 18, further comprising:
detecting the analog reference signal output falling below a selected minimum level; and
activating startup circuitry coupled to the temperature signal source to provide a non-zero analog temperature output.

21. The method of claim 18, further comprising:
sampling the analog compensation output during a selected gating period.

22. The method of claim 18, further comprising:
uncoupling the analog conversion device from the analog temperature output and the digital function device;
sampling an alternative input signal using the analog conversion device; and
coupling the analog conversion device to the analog temperature output and the digital function device.

23. The method of claim 22, wherein uncoupling the analog conversion device from the analog temperature output and the digital function device further comprises:
switching a plurality of inputs included in a multiplexer coupled to the analog temperature output.

24. The method of claim 22, wherein uncoupling the analog conversion device from the analog temperature output and the digital function device further comprises:
latching the digital compensation output.

25. The method of claim 18, further comprising:
recording raw temperature reference data provided by the analog conversion device over a selected temperature range; and
formulating a mathematical function based on the raw temperature reference data to apply to the digital temperature output.

26. The method of claim 18, further comprising:
providing a current to drive the reference signal source responsive to the analog reference signal output.

27. An article comprising a machine-accessible medium having associated information, wherein the information, when accessed, results in a machine performing:
providing a digital compensation output corresponding to a digital temperature output, wherein an analog temperature output is provided responsive to a combination signal comprising a combination of an analog compensation output and a reference signal, wherein the analog temperature output is converted to the digital temperature output responsive to an analog reference signal output, and wherein the digital compensation output is converted to the analog compensation output responsive to the analog reference signal output.

28. The article of claim 27, wherein the machine-accessible medium further includes data, which when accessed by the machine, results in the machine performing:
providing the digital compensation output corresponding to the digital temperature output according to a polynomial function.

29. The article of claim 28, wherein the polynomial function comprises a fixed-point polynomial function.

* * * * *